(12) United States Patent
Akimoto

(10) Patent No.: US 11,609,309 B2
(45) Date of Patent: Mar. 21, 2023

(54) HOUSING OF LIGHT EMISSION/RECEPTION DEVICE

(71) Applicant: DENSO CORPORATION, Kariya (JP)

(72) Inventor: Rentaro Akimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 400 days.

(21) Appl. No.: 16/849,465

(22) Filed: Apr. 15, 2020

(65) Prior Publication Data

US 2020/0241114 A1 Jul. 30, 2020

Related U.S. Application Data

(63) Continuation of application No. PCT/JP2018/038334, filed on Oct. 15, 2018.

(30) Foreign Application Priority Data

Oct. 17, 2017 (JP) .............................. JP2017-201048

(51) Int. Cl.
*H04N 5/44* (2011.01)
*G01S 7/481* (2006.01)

(52) U.S. Cl.
CPC ................... *G01S 7/4813* (2013.01)

(58) Field of Classification Search
CPC .......... G01S 7/4813; G02B 5/00; H01L 31/12
See application file for complete search history.

(56) References Cited

U.S. PATENT DOCUMENTS

| | | | | |
|---|---|---|---|---|
| 5,732,148 A * | 3/1998 | Keagy | ............... | G06V 40/1324 382/116 |
| 5,815,251 A * | 9/1998 | Ehbets | ................. | G01S 7/4818 356/5.1 |
| 7,728,957 B2 * | 6/2010 | Haase | .................... | G01S 17/48 356/3.01 |
| 8,743,088 B2 * | 6/2014 | Watanabe | ............... | G06F 3/042 250/221 |
| 2004/0105087 A1 * | 6/2004 | Gogolla | ................. | G01S 17/36 356/3 |
| 2004/0263825 A1 | 12/2004 | Stierle et al. | | |

(Continued)

FOREIGN PATENT DOCUMENTS

| JP | 63-27070 A | 2/1998 |
|---|---|---|
| JP | 2001-250979 A | 9/2001 |

(Continued)

*Primary Examiner* — Munear T Akki
(74) *Attorney, Agent, or Firm* — Maschoff Brennan

(57) ABSTRACT

A housing of a light emission/reception device includes a housing body and a window member. The housing body has an opening and accommodates a light emitting unit having one or more light emitting elements, and a light receiving unit having one or more light receiving elements. The window member covers the opening of the housing body, enables emitted light that is emitted from the light emitting unit to be transmitted therethrough toward the exterior of the housing, and enables incident light from the exterior of the housing to be transmitted therethrough, so that the incident light enters the light receiving unit. Also, the window member is provided with a propagation suppressing member configured to suppress propagation of light within the window member.

7 Claims, 11 Drawing Sheets

(56) References Cited

U.S. PATENT DOCUMENTS

| | | | | |
|---|---|---|---|---|
| 2007/0211329 A1* | 9/2007 | Haase | ................... | G01S 17/36 359/279 |
| 2008/0297759 A1* | 12/2008 | Skultety-Betz | ......... | G01S 17/32 356/3 |
| 2009/0153834 A1* | 6/2009 | Gogolla | .................. | G01S 17/10 356/4.01 |
| 2017/0074975 A1* | 3/2017 | Schmidtke | .............. | G01S 17/32 |

FOREIGN PATENT DOCUMENTS

| JP | 2005-510739 A | 4/2005 |
|---|---|---|
| JP | 2011-117940 A | 6/2011 |
| JP | 2011-214926 A | 10/2011 |
| JP | 2012-119448 A | 6/2012 |
| JP | 2013-160545 A | 8/2013 |
| JP | 2013-246048 A | 12/2013 |
| JP | 2016-085187 A | 5/2016 |
| JP | 2016-125898 A | 7/2016 |
| JP | 2016-206084 A | 12/2016 |
| JP | 2016-217971 A | 12/2016 |

\* cited by examiner

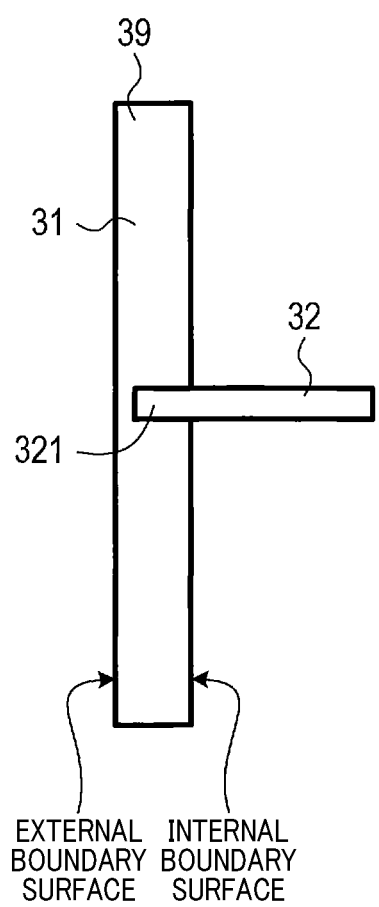

HOUSING OF LIGHT EMISSION/RECEPTION DEVICE

CROSS-REFERENCE TO RELATED APPLICATION

The present application is a continuation application of International Application No. PCT/JP2018/038334, filed on Oct. 15, 2018, which claims priority to Japanese Patent Application No. 2017-201048, filed on Oct. 17, 2017. The contents of these applications are incorporated herein by reference in their entirety.

BACKGROUND

Technical Field

The present disclosure relates to a housing of a light emission/reception device that emits and receives light.

Background Art

As one of measuring devices using light, there is known a distance measuring device that makes a light emitting element emit light to apply measurement light toward a preset monitoring region, makes a light receiving element receive light reflected from an object, and measures the distance to the object from the time required from light emission to light reception.

In this type of device, a light emitting element, a light receiving element, and other optical components are housed in a housing from the viewpoint of quality assurance and appearance. The housing is provided with a window part for emitting the measurement light and making the reflected light incident, and a window member made of a material that transmits the measurement light is attached to the window part.

SUMMARY

In the present disclosure, provided is a housing of a light emission/reception device as the following. The housing of a light emission/reception device includes a housing body and a window member. The window member is provided with a propagation suppressing member configured to suppress propagation of light within the window member.

BRIEF DESCRIPTION OF THE DRAWINGS

FIG. 11 is an explanatory view showing a variation of the window member in the first embodiment.

DETAILED DESCRIPTION OF THE PREFERRED EMBODIMENTS

In the prior art, note that part of the light emitted from the light emitting element is reflected at an internal boundary surface of the window member facing the interior of the housing, an external boundary surface thereof facing the exterior of the housing, or the like. The reception of this reflected light (hereinafter, return light) by the light receiving element causes a defect such as erroneous detection of an object that is actually not present in the distance corresponding to the path length of the return light.

To overcome this defect, PTL 1 describes a technique of providing a propagation suppression member between a light emitting element and a light receiving element inside a housing to thereby suppress return light.

[PTL 1] JP 2011-214926 A

However, as a result of the inventor's detailed review, the problem has been found that the prior art described in PTL 1 is effective for return light that is reflected from a window member and propagates in the housing, but cannot deal with return light that is repeatedly reflected on a boundary surface of the window member with respect to the exterior to propagate in the window member, and then arrives at the light receiving element.

One aspect of the present disclosure is to provide a technique of further suppressing return light that causes erroneous detection.

A housing of a light emission/reception device according to one embodiment of the present disclosure includes a housing body and a window member. The housing body has an opening and accommodates a light emitting unit having one or more light emitting elements and a light receiving unit having one or more light receiving elements. The window member covers the opening of the housing body, enables emitted light that is emitted from the light emitting unit to be transmitted therethrough toward the exterior of the housing, and enables incident light from the exterior of the housing to be transmitted therethrough, so that the incident light enters the light receiving unit. The window member is provided with a propagation suppressing member configured to suppress propagation of light within the window member.

Such a configuration can suppress return light that is emitted from the light emitting unit, repeatedly reflected on a boundary surface of the window member with respect to the exterior to propagate in the window member, and then is made incident on the light receiving unit. As a result, it is possible to suppress erroneous detection or erroneous determination based on the return light in processing to be carried out using light reception signals received by the light receiving unit.

Hereinafter, the embodiments of the present disclosure will be described with reference to the drawings.

1. First Embodiment

[1-1. Configuration]

Figure 1:
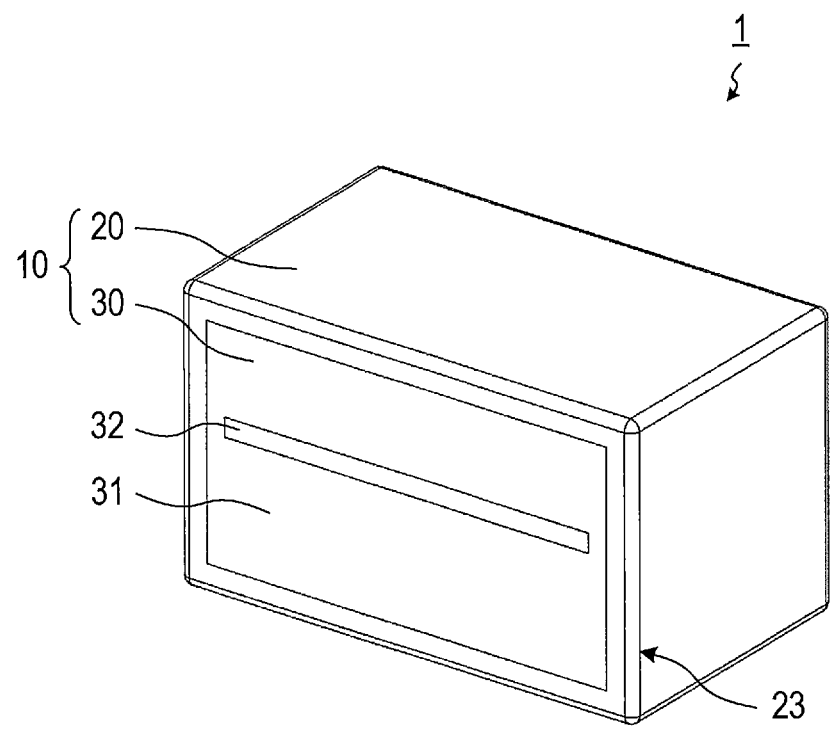
FIG. 1 is a perspective view showing the configuration of a light emission/reception device 1.
Figure 1:
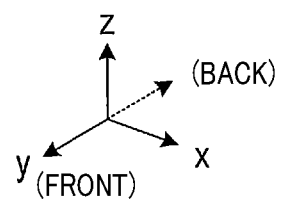
Figure 2:
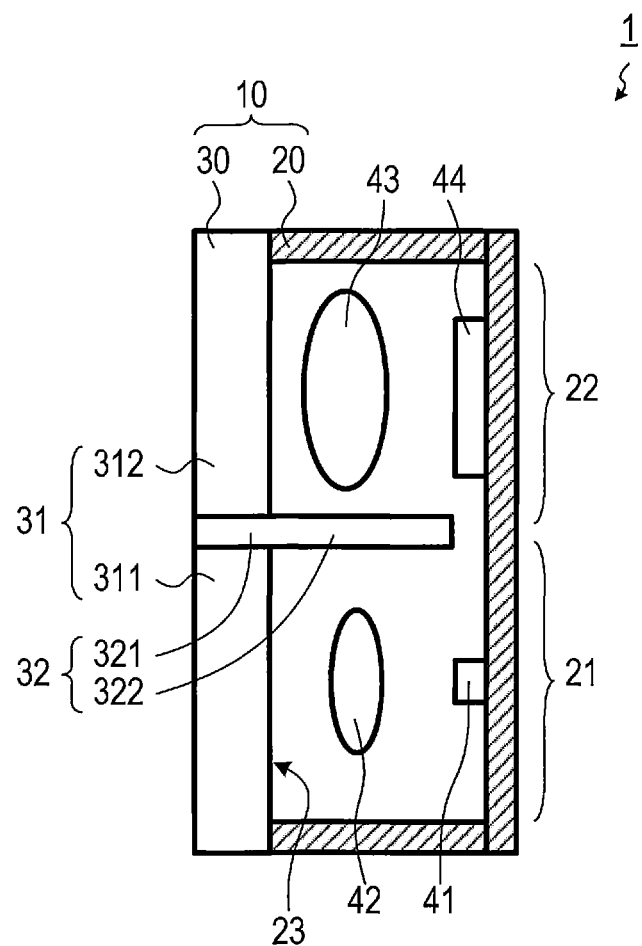
FIG. 2 is a cross sectional view showing, as an example, the shape of a window member in a first embodiment.

A light emission/reception device 1 shown in FIGS. 1 and 2 is a device for use in an on-vehicle laser radar, which emits and receives light.

The light emission/reception device 1 includes a housing 10. The housing 10 includes a housing body 20 and a window member 30. The housing body 20 is a box having an opening 23 in one surface, and has, for example, a rectangular parallelepiped outer shape. Note that the outer shape of the housing body 20 is not particularly limited to be a rectangular parallelepiped, and various shapes can be adopted. The window member 30 is attached to the housing body 20 so as to cover the opening 23. Hereinafter, a surface in which the opening 23 is formed is referred to as xz plane; an axis along the longitudinal direction of the opening 23 is referred to as x axis; an axis along the lateral direction of the opening 23 is referred to as z axis; and an axis orthogonal to the xz plane is referred to as y axis. A side of the opening 23 when viewed from the interior of the housing body 20 in the y-axis direction is referred to as front side, and the opposite side is referred to as back side. The x-axis direction is referred to as transverse direction, and the z-axis direction is referred to as vertical direction.

The housing body 20 accommodates at least a light emitting unit 41, a light projecting lens 42, a light receiving lens 43, and a light receiving unit 44. In an internal space formed by the housing body 20, a half space positioned on a lower side is referred to as lower accommodation part 21, and a half space positioned on an upper side is referred to as upper accommodation part 22.

The light emitting unit 41 has one or more light emitting elements that emit infrared rays. The light emitting unit 41 is arranged in the lower accommodation part 21. The light projecting lens 42 is arranged between the light emitting unit 41 and the window member 31. The light projecting lens 42 forms the light emitted from the light emitting unit 41 into a desired beam shape and applies the beam-shaped light, as measurement light, to the exterior of the housing 10 via the window member 30.

The light receiving unit 44 has one or more light receiving elements that receive infrared rays. The light receiving unit 44 is arranged in the upper accommodation part 22. That is, the light receiving unit 44 is arranged above the light emitting unit 41. The light receiving lens 43 is arranged between the light receiving unit 44 and the window member 31. The light receiving lens 43 converges the incident light coming from the exterior of the housing 10 and makes the light receiving unit 44 receive the incident light. The window member 30 includes a window body 31 and a propagation suppressing member 32.

The window body 31 is a plate-shaped member having such a size and a shape as to cover the opening 23 of the housing body 20. The window body 31 is molded using a resin material having a characteristic of transmitting infrared rays and shielding visible rays. In the window body 31, a part covering the lower accommodation part 21 is referred to as emission part 311, and a part covering the upper accommodation part 22 is referred to as incident part 312.

The propagation suppressing member 32 is a plate-shaped member arranged between the emission part 311 and the incident part 312 and formed integrally with the window body 31. The propagation suppressing member 32 has one end (hereinafter, back side end) that protrudes into an accommodation space formed by the housing body 20 so as to partition the accommodation space into the lower accommodation part 21 and the upper accommodation part 22, and the other end (hereinafter, front side end) that forms the same surface as a boundary surface of the window body 31 with respect to the exterior of the housing. Briefly, the propagation suppressing member 32 is provided over the entire thickness direction of the window body 31. However, the propagation suppressing member 32 has a size such that a gap is formed between the propagation suppressing member 32 and the housing body 20 at all of the back side end and both ends in the lateral direction. The propagation suppressing member 32 is molded using a resin material having a characteristic of shielding both infrared rays and visible rays.

Hereinafter, in the propagation suppressing member 32, a part embedded in the window body 31 is referred to as embedded part 321, and a part protruded toward the accommodation space side is referred to as inwardly protruded part 322.

For production of the window member 30, for example, insert molding or two-color molding may be used. In the case of insert molding, either the window body 31 or the propagation suppressing member 32 may be molded first, but it is desirable to mold the propagation suppressing member 32 first and then to mold the window body 31 that is required to have stricter shape accuracy.

Also, the desired characteristics of the window body 31 and the propagation suppressing member 32 may be realized, for example, by adding different additives to identical base materials. However, different base materials may be used for the window body 31 and the propagation suppressing member 32 as long as equivalent appearances such as gloss and color can be realized. The base materials are not limited to synthetic resins, and glass and the like may be used.

[1-2. Action]

Figure 3:
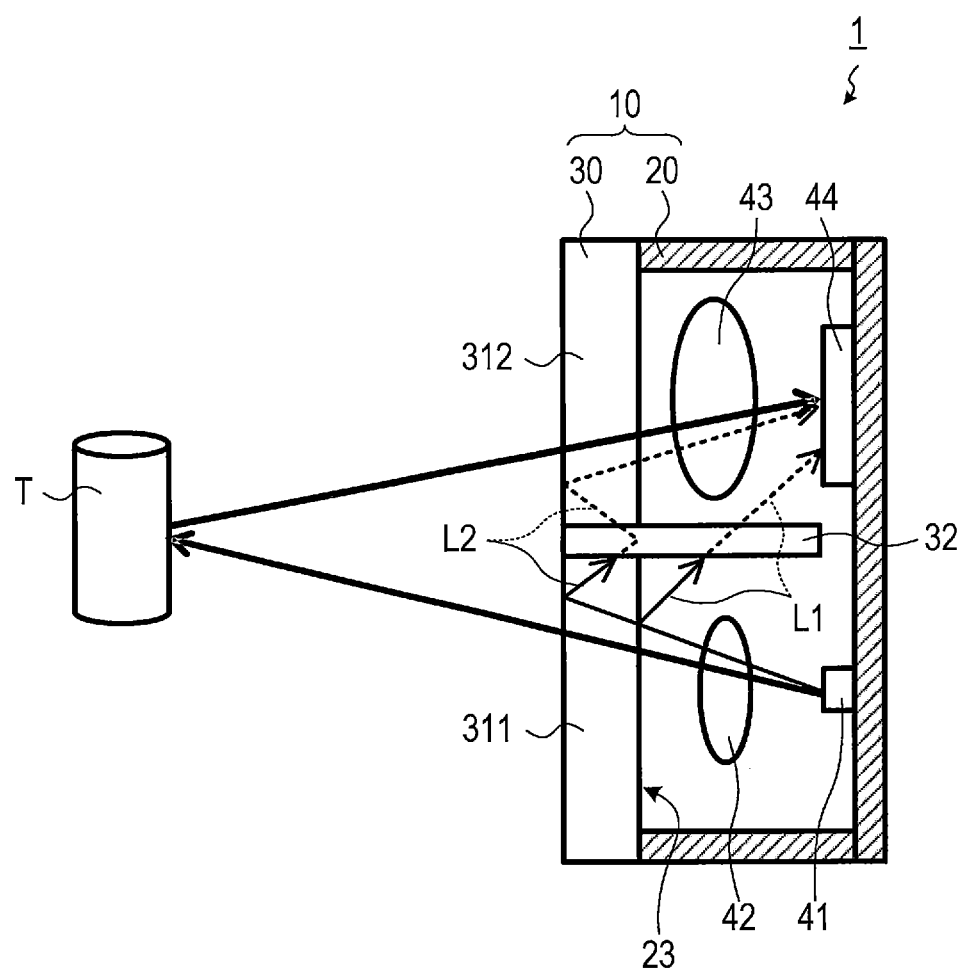
FIG. 3 is an explanatory view showing the action of a propagation suppressing member.

In the thus-configured light emission/reception device 1, the light emitted from the light emitting unit 41 is applied, as measurement light, to the exterior of the housing 10 via the light projecting lens 42 and the emission part 311 of the window body 31, and reflected on an object T to be measured, as indicated by thick solid lines in FIG. 3. The reflected light coming from the object T is received by the light receiving unit 44 via the incident part 312 of the window body 31 and the light receiving lens 43.

The light emitted from the light emitting unit 41 is not only applied, as measurement light, to the exterior of the housing 10, but also reflected, for example, on an internal boundary surface and an external boundary surface of the window body 31, and part of the reflected light serves as return light toward the light receiving unit 44. The external boundary surface is a surface on a side in contact with the exterior of the housing 10 in the window body 31. The internal boundary surface is a surface on a side in contact with the interior of the housing 10, i.e., the accommodation space, in the window body 31.

Paths of the return light include, for example, a path pattern L1 in which the return light is directly toward the light receiving unit 44 in the accommodation space of the housing body 20, and a path pattern L2 in which the return light propagates in the window body 31, and then is toward the light receiving unit 44. However, the return light that directly propagates in the accommodation space, as typified by the path pattern L1, is directly inhibited, by the inwardly protruded part 322 of the propagation suppressing member 32, from propagating toward the light receiving unit 44. Further, the return light that propagates in the window body 31, as typified by the path pattern L2, is inhibited, by the embedded part 321 of the propagation suppressing member 32, from propagating in the window member 30, and thus is indirectly inhibited from propagating toward the light receiving unit 44. Note that paths indicated by dot lines in FIG. 3 are paths of the return light when there is no propagation suppressing member 32.

[1-3. Effect]

The First Embodiment described in detail above provides the following effects.

(1a) The propagation suppressing member 32 that shields the measurement light, i.e., infrared rays, has the embedded part 321 that is embedded between the emission part 311 and the incident part 312 in the window body 31, and the inwardly protruded part 322 that is protruded between the lower accommodation part 21 and the upper accommodation part 22.

Therefore, not only the return light that propagates in the accommodation space, but also the return light that propagates inside the window body 31 can be suppressed. As a result, it is possible to reduce erroneous detection or erroneous determination based on the return light in processing using light reception signals.

(1b) The desired characteristics of the window body 31 and propagation suppressing member 32 forming the window member 30 are realized, for example, by adding different additives to identical base materials. In particular, the characteristic of shielding visible rays is imparted to both the window body 31 and propagation suppressing member 32. Therefore, the color and texture of the window body 31 and propagation suppressing member 32, when viewed from the exterior of the housing 10, can be made almost uniform, thereby improving the appearances of the window member 30.

In short, this type of device may be placed at locations exposed to the public, such as automobiles and public facilities, and thus is required to have good a appearance. For example, when the emission part 311 and the incident part 312 are firstly formed to be separated from each other, it is possible to suppress the return light that propagates in the window member without providing the propagation suppressing member 32. In this case, such an appearance that the window member is partitioned into two parts is obtained. However, in the window member 30 in the present embodiment, the boundary between the window body 31 and the propagation suppressing member 32 is hard to recognize from the exterior. So, it is also possible to realize an excellent appearance while suppressing the return light.

[1-4. Variants]

In this embodiment, the propagation suppressing member 32 has the embedded part 321 provided over the entire area from the external boundary surface to the internal boundary surface of the window body 31. However, the present disclosure is not limited to this. For example, the propagation suppressing member 32 may be provided so that a gap is formed between the embedded part 321 and the external boundary surface, as in the window member 39 shown in FIG. 11. In this case, the appearances of the part where the propagation suppressing member 32 is provided and the other parts can have a more uniform appearance in the window member 39, and the appearance can be further improved.

2. Second Embodiment

[2-1. Difference from First Embodiment]

A Second Embodiment is similar to the First Embodiment in basic structure, and thus its difference therefrom will be described below. Note that the same reference numerals as those in the first embodiment represent the same components, and the preceding explanations will be referred to.

The second embodiment is different from the first embodiment in shape of the propagation suppressing member.

Figure 4:
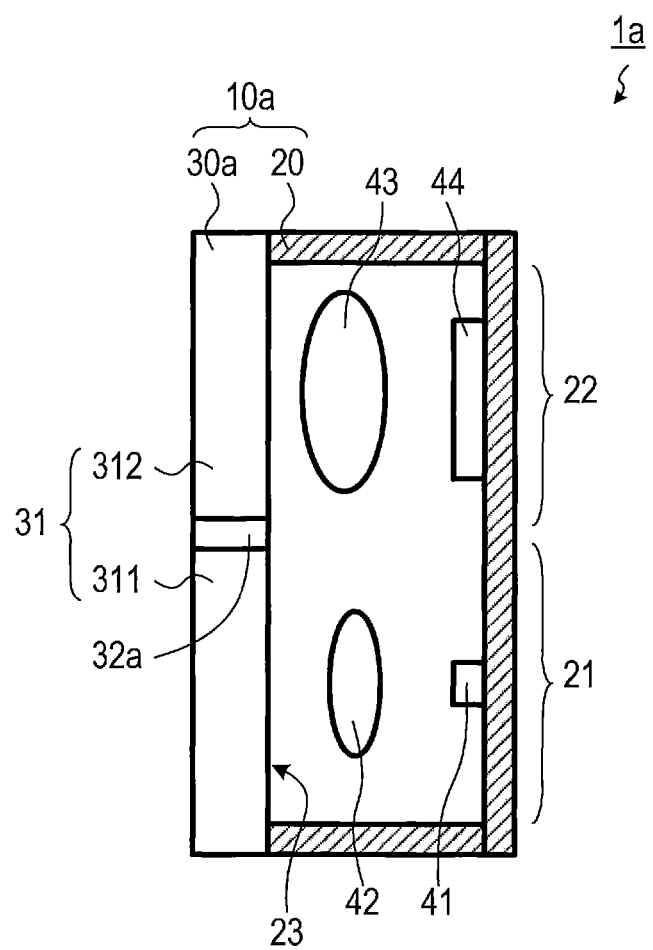
FIG. 4 is a cross sectional view showing, for example, the shape of a window member in a second embodiment.

As shown in FIG. 4, in a light emission/reception device 1a of the second embodiment, a housing 10a includes the housing body 20 and a window member 30a. Also, the window member 30a includes the window body 31 and a propagation suppressing member 32a.

The propagation suppressing member 32a has a structure in which the inwardly protruded part 322 in the propagation suppressing member 32 in the First Embodiment is omitted. That is, the propagation suppressing member 32a has only a part corresponding to the embedded part 321.

[2-2. Effect]

The Second Embodiment described in detail above provides the effect (1b) of the first embodiment described above and further provides the following effect.

(2a) The propagation suppressing member 32a that shields the measurement light, i.e., infrared rays, is embedded between the emission part 311 and the incident part 312 in the window body 31. Therefore, the return light that propagates in the window body 31 can be suppressed. As a result, it is possible to reduce erroneous detection or erroneous determination based on the return light in processing using light reception signals.

In this embodiment, the housing body 20 may be provided with a light shielding wall that shields infrared rays between the lower accommodation part 21 and the upper accommodation part 22.

[2-3. Variation]

In this embodiment, the propagation suppressing member 32a is provided over the entire area from the external boundary surface to the internal boundary surface of the window body 31. However, the present disclosure is not limited to this.

Figure 5:
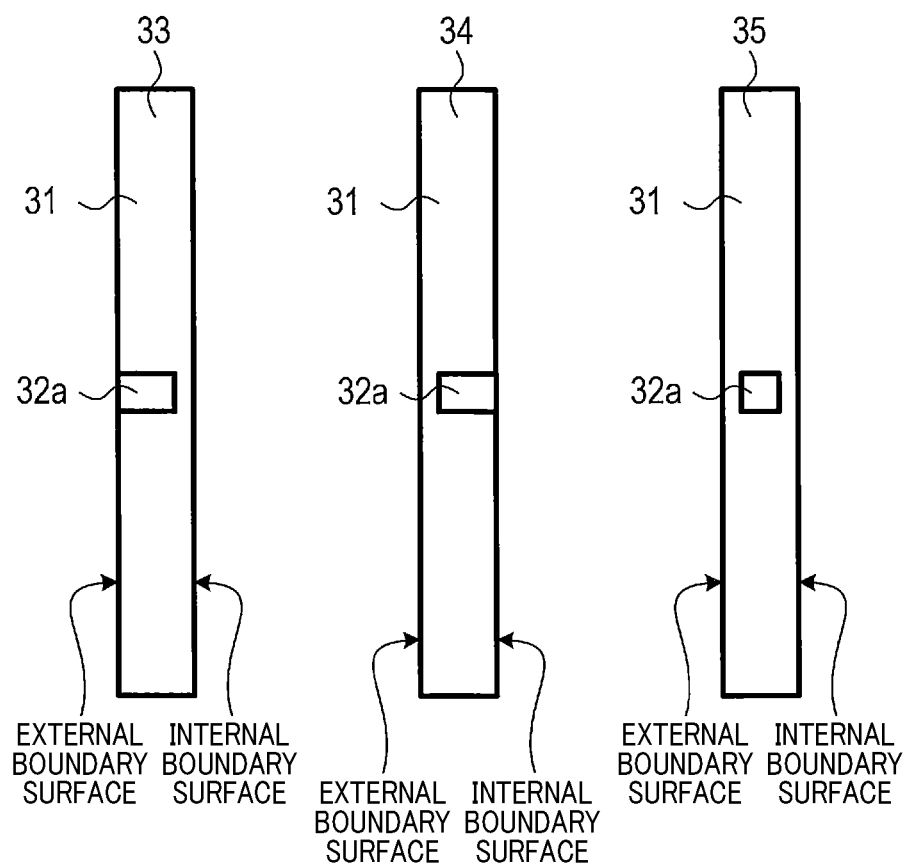
FIG. 5 is an explanatory view showing a variation of the window member in the second embodiment.

For example, as shown in FIG. 5, a window member 33 with a gap formed between the propagation suppressing member 32a and the internal boundary surface, conversely, a window member 34 with a gap formed between the propagation suppressing member 32a and the external boundary surface, or a window member 35 with a first gap formed between the propagation suppressing member 32a and the internal boundary surface and a second gap formed between the propagation suppressing member 32a and the external boundary surface, may be used. In particular, when a gap is formed between the propagation suppressing member 32a and the external boundary surface, the appearances of the part where the propagation suppressing member 32a is provided and the other parts can look more uniform, and the appearances can be further improved.

3. Third Embodiment

[3-1. Difference from First Embodiment]

A third embodiment is similar to the first embodiment in basic structure, and thus its differences therefrom will be described below. Note that the same reference numerals as those in the first embodiment represent the same components, and the preceding explanations will be referred to.

The third embodiment is different from the first embodiment in shape of the propagation suppressing member.

Figure 6:
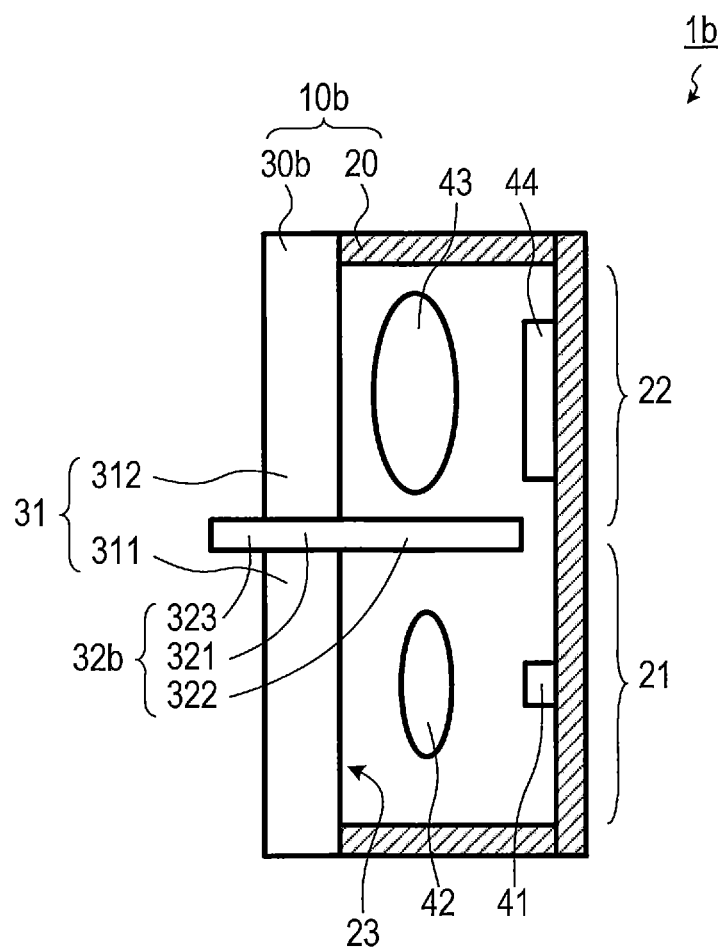
FIG. 6 is a cross sectional view showing, for example, the shape of a window member in a third embodiment.

As shown in FIG. 6, in a light emission/reception device 1b of the Third Embodiment, a housing 10b includes the housing body 20 and a window member 30b. Also, the window member 30b includes the window body 31 and a propagation suppressing member 32b.

The propagation suppressing member 32b has a structure in which an outwardly protruded part 323 that is protruded from the external boundary surface is added to the propagation suppressing member 32 of the First Embodiment. The quantity of protrusion of the outwardly protruded part 323 from the external boundary surface is set to be equivalent to the size of an attachment such as water drops and dust which can be attached to the external boundary surface.

[3-2. Action]

Figure 7:
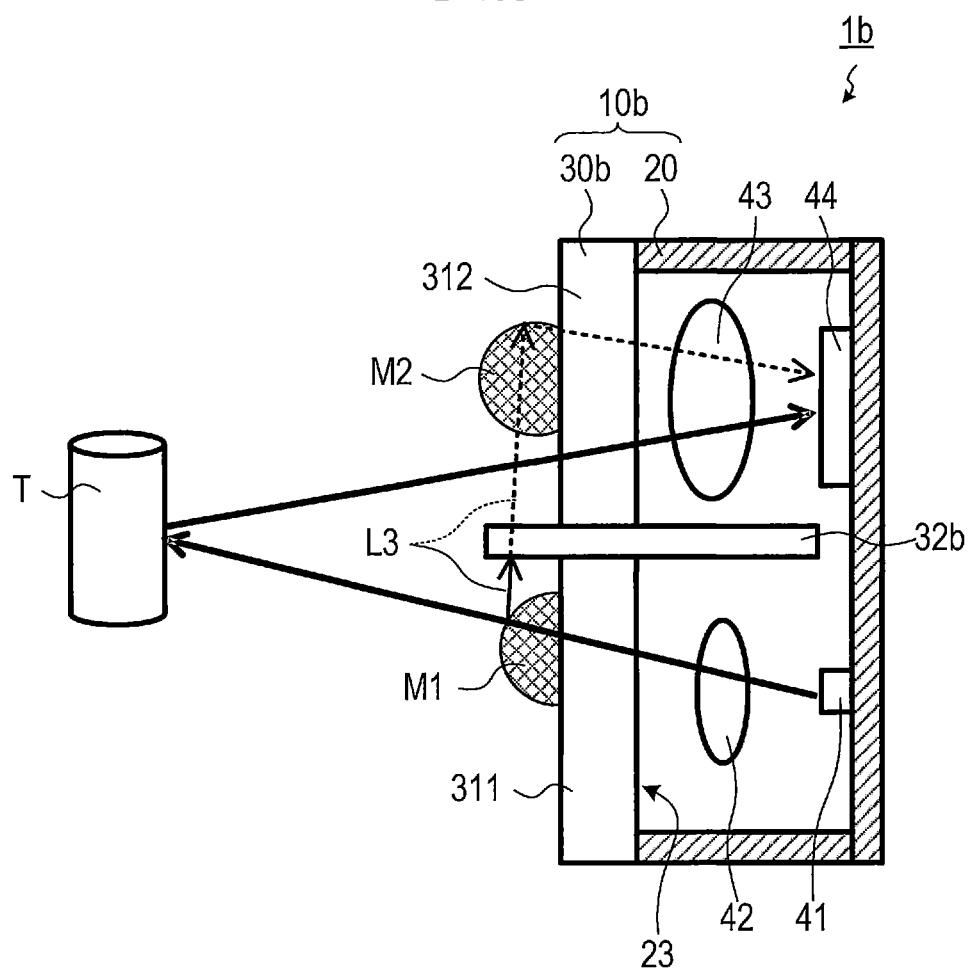
FIG. 7 is an explanatory view showing the action of a propagation suppressing member.

As shown in FIG. 7, the light emitted from the light emitting unit 41 is not only applied, as measurement light, to the exterior of the housing 10, but also reflected, for example, by an attachment M1 attached to the external boundary surface of the emission part 311 of the window body 31, and part of the reflected light is toward an attachment M2 attached to the external boundary surface of the incident part 312. Further, part of the light reflected by the attachment M2 serves as return light directed toward the light receiving unit 44.

That is, in the case where the device is used in an environment where the attachments M1 and M2 may be attached, the paths of the return light include, in addition to the path patterns L1 and L2 shown in FIG. 3, a path pattern L3 in which the return light is reflected on the attachments M1 and M2 and directed toward the light receiving unit 44. However, in the light emission/reception device 1b, the return light that propagates via the attachments M1 and M2, as typified by the path pattern L3, is inhibited from propagating, by the outwardly protruded part 323 of the propagation suppressing member 32b.

[3-3. Effect]

The third embodiment described in detail above provides the effects (1a) and (1b) of the first embodiment described above and further provides the following effect.

(3a) The propagation suppressing member 32a that shields the measurement light, i.e., infrared rays, has the outwardly protruded part 323 that is protruded from the external boundary surface of the window body 31. Therefore, the propagation of the return light reflected on the attachment attached to the external boundary surface of the window body 31 and directed toward the light receiving unit 44 can be suppressed. As a result, it is possible to further reduce erroneous detection or erroneous determination based on the return light in processing using light reception signals.

[3-4. Variation]

In this embodiment, the outwardly protruded part 323 of the propagation suppressing member 32b is formed into a simple plate shape, but the present disclosure is not limited thereto.

Figure 8:
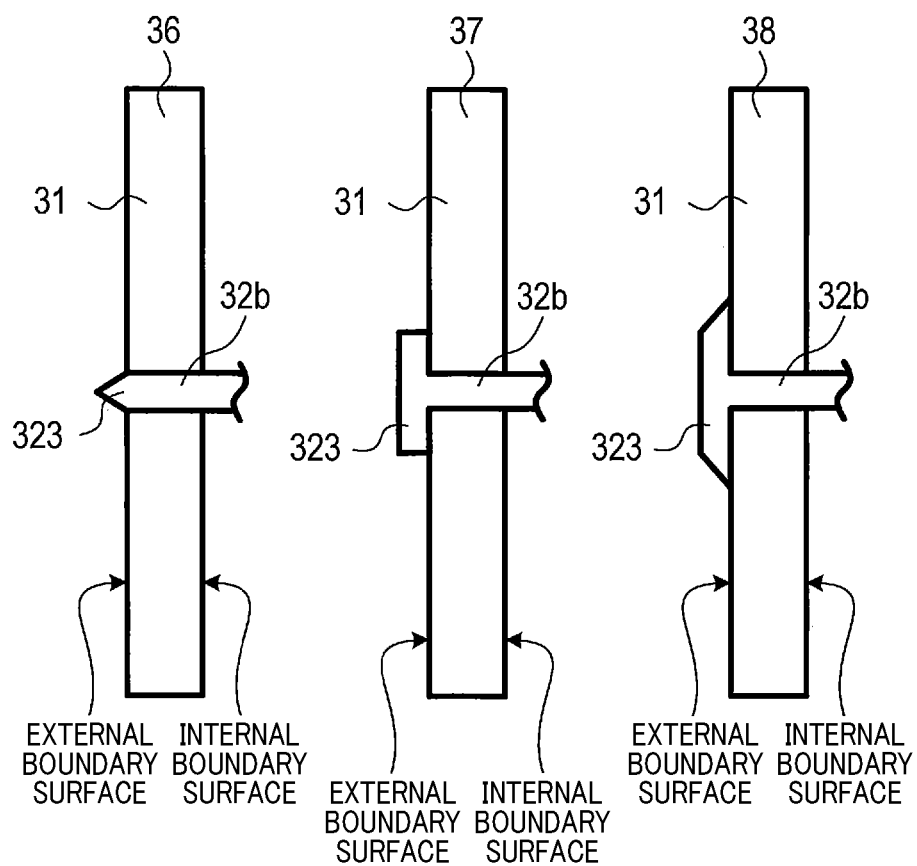
FIG. 8 is an explanatory view showing a variation of the window member in the third embodiment.

For example, as shown in FIG. 8, a window member 36 having a shape with a sharpened tip end of the outwardly protruded part 323 may be used. Also, there may be used a window member 37 having a T-shaped cross sectional shape obtained by slightly widening a tip end of the outwardly protruded part 323 along the external boundary surface. Further, there may be used a window member 38 in which the outwardly protruded part 323 of the window member 37 has a trapezoidal cross sectional shape having a side in contact with the external boundary surface which is longer than the opposite side. In particular, the outwardly protruded part 323 of the window member 36 or 38 has a shape inclined to the external boundary surface. Therefore, it is possible to suppress the attachment from continuing to stay on the outwardly protruded part 323.

4. Fourth Embodiment

[4-1. Difference from First Embodiment]

A fourth embodiment is similar to the first embodiment in basic structure, and thus its differences therefrom will be described below. Note that the same reference numerals as those in the first embodiment represent the same components, and the preceding explanations will be referred to.

The fourth embodiment is different from the First Embodiment in shape of the propagation suppressing member.

Figure 9:
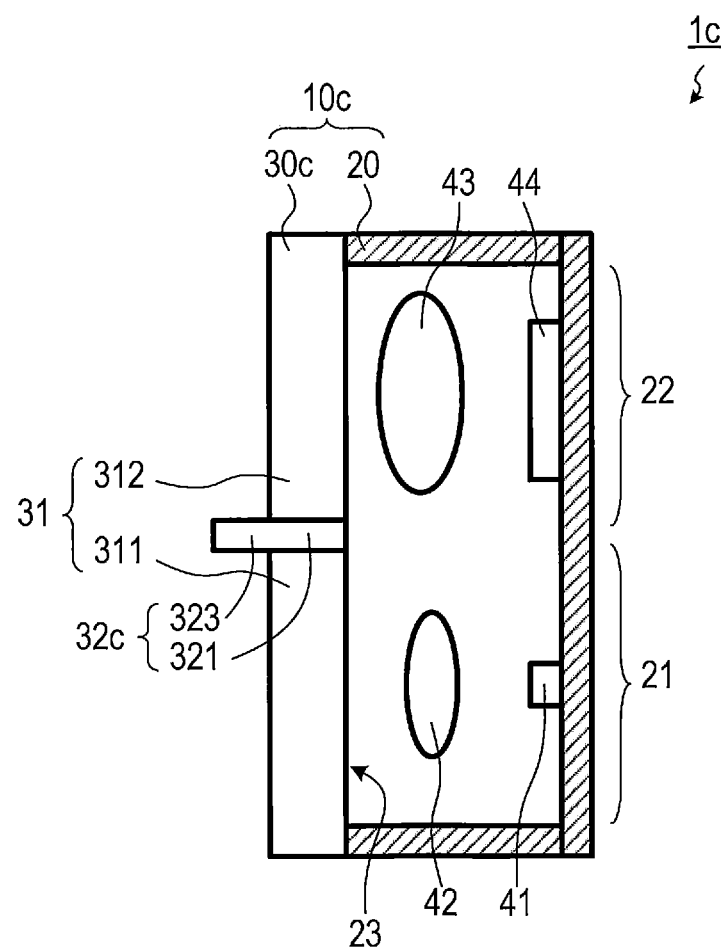
FIG. 9 is a cross sectional view showing, the shape of a window member and the like in a fourth embodiment.

As shown in FIG. 9, in a light emission/reception device 1c of the fourth embodiment, a housing 10c includes the housing body 20 and a window member 30c. Also, the window member 30c includes the window body 31 and a propagation suppressing member 32c.

The propagation suppressing member 32c has a structure in which the inwardly protruded part 322 in the propagation suppressing member 32 of the first embodiment is omitted and the outwardly protruded part 323 in the propagation suppressing member 32b of the third embodiment is added.

[4-2. Effects]

The fourth embodiment described in detail above provides the effects (1b), (2a) and (3a) of the first to third embodiments described above.

5. Other Embodiments

The embodiments of the present disclosure have been described above. However, the present disclosure is not limited to the above-described embodiments, and may be carried out in various modified forms.

Figure 10:
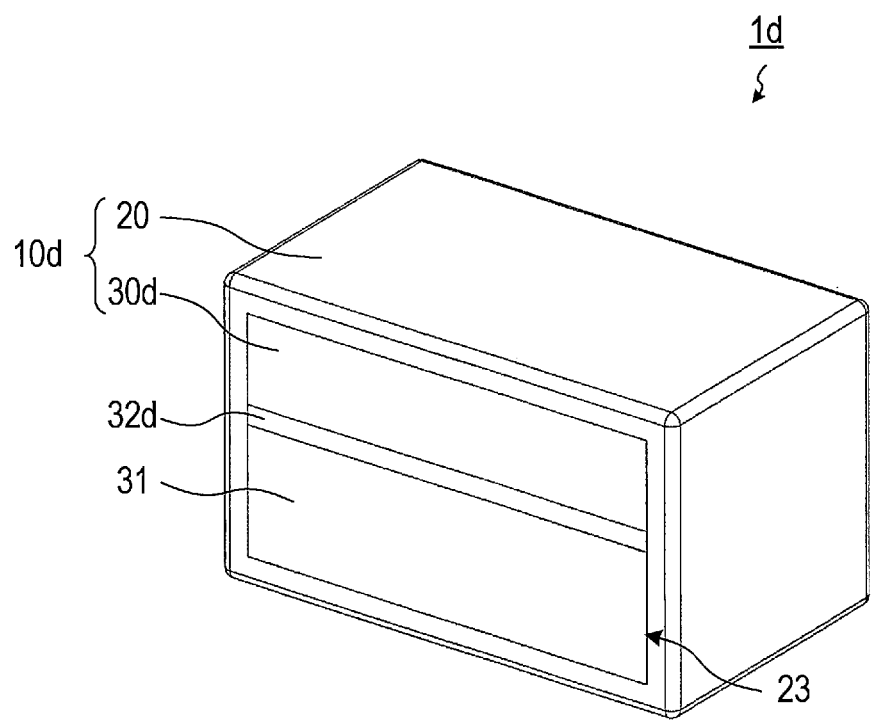
FIG. 10 is an explanatory view showing a variation of the position for forming the propagation suppressing member.

(5a) In the above embodiments, a gap is formed between the propagation suppressing member 32 and the housing body 20, but the present disclosure is not limited to this. For example, like a housing 10d of a light emission/reception device 1d shown in FIG. 10, a propagation suppressing member 32d of a window member 30d may have such a size as to be in contact with both the wall surfaces of the housing body 20 in the transverse direction. Further, the propagation suppressing member 32d may have such a size to be in contact with the wall surface on the back side of the housing body 20.

(5b) A plurality of functions of one constituent element in the above embodiment may be realized by a plurality of constituent elements, or one function of one constituent element may be realized by a plurality of constituent elements. In addition, a plurality of functions of a plurality of constituent element may be realized by one constituent element, or one function realized by a plurality of constituent elements may be realized by one constituent element. Moreover, a part of the components of the above-described embodiment may be omitted. Furthermore, at least a part of the components of the above-described embodiment may be added to or replaced with the components of another embodiment described above.

(5c) In addition to the housing of the light emission/reception device described above, the present disclosure can also be realized in various forms such as a system including the light emission/reception device as a component and a method of suppressing return light.

What is claimed is:

1. A housing of a light emission/reception device comprising:
   a housing body having an opening and configured to accommodate a light emitting unit having one or more light emitting elements and a light receiving unit having one or more light receiving elements; and
   a window member configured to
      cover the opening of the housing body, enable emitted light that is emitted from the light emitting unit to be transmitted therethrough toward the exterior of the housing, and enable incident light from the exterior of the housing to be transmitted therethrough, so that the incident light enters the light receiving unit, wherein the window member is provided with a propagation suppressing member configured to suppress propagation of light within the window member, wherein the propagation suppressing member is made of a material that suppresses both transmission of visible light and transmission of measurement light which is different from the visible light to be emitted by the light emitting unit or received by the light receiving unit, and wherein the window member comprises a window body which constitutes a part other than the propagation suppressing member of the window member, the window body being made of a material that enables the measurement light and suppresses transmission of the visible light to be transmitted therethrough.

2. The housing of a light emission/reception device according to claim 1, wherein the propagation suppressing member is configured to be positioned between an emission part and an incident part, the emission part being configured to enable the emitted light emitted from the light emitting unit to be transmitted therethrough, the incident part being configured to enable the incident light to be transmitted therethrough, so that the incident light enters the light receiving unit.

3. The housing of a light emission/reception device according to claim 1, wherein the window member has a thickness in a thickness direction in which each of the emitted light and incident light is transmitted therethrough, and the propagation suppressing member is provided entirely over the thickness direction of the window member.

4. The housing of a light emission/reception device according to claim 1, wherein the propagation suppressing member is provided partially over the thickness direction of the window member.

5. The housing of a light emission/reception device according to claim 1, wherein the housing body has an inner space in which the light emitting unit and the light receiving unit are accommodated, and the propagation suppressing member is configured to have an inwardly protruded part that is protruded toward the inner space of the housing body.

6. The housing of a light emission/reception device according to claim 1, wherein the housing body has an inner space in which the light emitting unit and the light receiving unit are accommodated, and the propagation suppressing member is configured to have an outwardly protruded part that is protruded toward a side opposite to the inner space.

7. The housing of a light emission/reception device according to claim 1, wherein the propagation suppressing member and the window body are respectively made of materials having equivalent appearances.

* * * * *